United States Patent
Inaba (10) Patent No.: US 7,215,569 B2
(45) Date of Patent: May 8, 2007

(54) SEMICONDUCTOR INTEGRATED CIRCUIT DEVICE AND METHOD OF MANUFACTURING THE SAME

(75) Inventor: Satoshi Inaba, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 172 days.

(21) Appl. No.: 11/117,721

(22) Filed: Apr. 29, 2005

(65) Prior Publication Data

US 2006/0104108 A1 May 18, 2006

(30) Foreign Application Priority Data

Nov. 15, 2004 (JP) ............................ 2004-330557

(51) Int. Cl.
*G11C 11/00* (2006.01)
(52) U.S. Cl. ................. 365/154; 365/189.05; 257/326; 257/365
(58) Field of Classification Search ................ 365/154, 365/189.05; 257/326, 365
See application file for complete search history.

(56) References Cited

U.S. PATENT DOCUMENTS

| | | | |
|---|---|---|---|
| 4,819,043 A | 4/1989 | Yazawa et al. | |
| 5,583,361 A | 12/1996 | Morishita | |
| 6,424,011 B1 * | 7/2002 | Assaderaghi et al. | ....... 257/350 |
| 2002/0093064 A1 | 7/2002 | Inaba | |

FOREIGN PATENT DOCUMENTS

JP 2002-289850 A 10/2002

OTHER PUBLICATIONS

S. Inaba et al., "Silicon on Depletion Layer FED (SODEL FED) for Sub-50 nm High performance CMOS Applications: Novel Channel and S/D Profile Engineering Schemes by Selective Si Epitaxial Growth Technology", IEDM, 2002, pp. 659-662.
Y. Tsukamoto et al., "Comparison of the Interconnect Capacitances of Various SRAM Cell Layouts To Achieve High Speed, Low, Power SRAM Cells", Extended Abstracts of the 2003 International Conference on Solid State Devices and Materials, 2003, pp. 22-23.

* cited by examiner

Primary Examiner—Son Dinh
Assistant Examiner—N Nguyen
(74) Attorney, Agent, or Firm—Foley & Lardner LLP (57) ABSTRACT

A semiconductor integrated circuit device comprises a first transistor formed on a bulk substrate region in a semiconductor substrate and having a source or drain layer connected to a first reference voltage; and a second transistor including an impurity layer region formed on the bulk substrate region and being of a conductivity type different from that of the bulk substrate region, a semiconductor region formed on the impurity layer region and being of a conductivity type the same as that of the bulk substrate region, a source layer and a drain layer formed in the semiconductor region and being of a conductivity type different from that of the bulk substrate region, a gate insulating film provided between the source layer and the drain layer and formed on the semiconductor region, a gate electrode formed on the gate insulating film, and a body region surrounded by the source layer, the drain layer, the impurity layer region, and the gate insulating film on a section along a source-drain direction and being of a conductivity type the same as that of the bulk substrate region, the impurity layer region being depleted, wherein the source layer or the drain layer of the second transistor is connected to the first reference voltage through the first transistor.

10 Claims, 10 Drawing Sheets

100

WL ---WORD LINE
BL ---BIT LINE
TSn1,TSn2 ---n-TYPE SODEL-FETs
TBn1,TBn2 ---n-TYPE TRANSISTORS FORMED ON SEMICONDUCTOR BULK
TBp1,TBp2 ---p-TYPE TRANSISTORS FORMED ON SEMICONDUCTOR BULK

100

WL ··· WORD LINE
BL ··· BIT LINE
TSn1, TSn2 ··· n-TYPE SODEL-FETs
TBn1, TBn2 ··· n-TYPE TRANSISTORS FORMED ON SEMICONDUCTOR BULK
TBp1, TBp2 ··· p-TYPE TRANSISTORS FORMED ON SEMICONDUCTOR BULK

MC⋯MEMORY CELL
An, Ap⋯ACTIVE AREA
$C_W, C_{N1}, C_{N2}, C_B, C_{VO}, C_G$⋯CONTACT
50⋯GATE
TSn1, TSn2⋯n-TYPE SODEL TRANSISTOR
TBn1, TBn2⋯n-TYPE TRANSISTORS FORMED ON SEMICONDUCTOR BULK
TBp1, TBp2⋯p-TYPE TRANSISTORS FORMED ON SEMICONDUCTOR BULK

FIG. 11
700

SEMICONDUCTOR INTEGRATED CIRCUIT DEVICE AND METHOD OF MANUFACTURING THE SAME

CROSS-REFERENCE TO RELATED APPLICATION

This application is based upon and claims the benefit of priority from the prior Japanese Patent Application No. 2004-330557, filed on Nov. 15, 2004, the entire contents of which are incorporated herein by reference.

BACKGROUND OF THE INVENTION

1. Field of the Invention

The present invention relates to a semiconductor integrated circuit device and a method of manufacturing the same.

2. Related Art

A logic circuit such as an SRAM or a clocked inverter is required to be reduced in operating voltage and to be increased in speed. In the SRAM, a reduction of bit line capacitance is contributed to a high-speed operation more greatly than a reduction of word line capacitance (see Y. Tsukamoto et al.: SSDM 2003, pages 22 and 23). The bit line capacitance includes the wiring capacitance of the bit line and the parasitic capacitance of a transistor of a transfer gate connected to the bit line.

The parasitic capacitance of the transfer gate consists of a junction capacitance of the source or the drain of the transfer gate. A reduction of the junction capacitance of the diffusion layer in the transfer gate is important to realize a high-speed operation of an SRAM. In particular, when the SRAM is operated by a lower power supply voltage, the SRAM is considerably influenced by the junction capacitance of the diffusion layer.

An impurity profile of the diffusion layer of the transfer gate may be changed to reduce the junction capacitance. However, the junction capacitances of a driver transistor (pull-down transistor) and a load transistor (pull-up transistor) used in an inverter part of the SRAM also decrease. This deteriorates data holding capability to cause a soft error by cosmic ray irradiation.

In a logic circuit such as a clocked inverter circuit, when the impurity profile of the diffusion layer of a transistor is changed to realize a high-speed operation, the resistance to noise (noise margin) is deteriorated disadvantageously due to lower node capacitance.

Therefore, there is provided a semiconductor integrated circuit device which has high resistance to a soft error and noise while reducing the junction capacitance of the transistor.

SUMMARY OF THE INVENTION

A semiconductor integrated circuit device according to an embodiment of the present invention comprises a first transistor formed on a bulk substrate region in a semiconductor substrate and having a source or drain layer connected to a first reference voltage; and a second transistor including an impurity layer region formed on the bulk substrate region and being of a conductivity type different from that of the bulk substrate region, a semiconductor region formed on the impurity layer region and being of a conductivity type the same as that of the bulk substrate region, a source layer and a drain layer formed in the semiconductor region and being of a conductivity type different from that of the bulk substrate region, a gate insulating film provided between the source layer and the drain layer and formed on the semiconductor region, a gate electrode formed on the gate insulating film, and a body region surrounded by the source layer, the drain layer, the impurity layer region, and the gate insulating film on a section along a source-drain direction and being of a conductivity type the same as that of the bulk substrate region, the impurity layer region being depleted, wherein the source layer or the drain layer of the second transistor is connected to the first reference voltage through the first transistor.

A semiconductor integrated circuit device according to an embodiment of the present invention which is includes an ALU executing an arithmetic operation or a logical calculation to output the result from an output node, comprises, a first transistor formed on a bulk substrate region in a semiconductor substrate and having a source or a drain layer connected to a first reference voltage; and a second transistor including an impurity layer region formed on the bulk substrate region and being of a conductivity type different from that of the bulk substrate region, a semiconductor region formed on the impurity layer region and being of a conductivity type the same as that of the bulk substrate region, a source layer and a drain layer formed in the semiconductor region and being of a conductivity type different from that of the bulk substrate region, a gate insulating film provided between the source layer and the drain layer and formed on the semiconductor region, a gate electrode formed on the gate insulating film, and a body region surrounded by the source layer, the drain layer, the impurity layer region, and the gate insulating film on a section along a source-drain direction and being of a conductivity type same as that of the bulk substrate region, the impurity layer region being depleted, wherein a transistor connected to the output node is the second transistor.

A method of manufacturing a semiconductor integrated circuit device according to an embodiment of the invention, the method includes a first transistor formed on a bulk substrate region in a semiconductor substrate, having a source or drain layer connected to a first reference voltage, and being of a first conductivity type or a second conductivity type; and a second transistor including an impurity layer region formed on the bulk substrate region and being of a conductivity type different from that of the bulk substrate region, a semiconductor region formed on the impurity layer region and being of a conductivity type the same as that of the bulk substrate region, a source layers and a drain layer formed in the semiconductor region and being of a conductivity type different from that of the bulk substrate region, a gate insulating film provided between the source layer and the drain layer and formed on the semiconductor region, a gate electrode formed on the gate insulating film, and a body region surrounded by the source layer, the drain layer, the impurity layer region, and the gate insulating film on a section along a source-drain direction and being of a conductivity type the same as that of the bulk substrate region, the impurity layer region being depleted, in which the source or drain layer of the second transistor is connected to the first reference voltage through the first transistor, the method comprising:

covering a forming region of the first transistor with a first mask material;

implanting an impurity in a channel region of the second transistor to form the impurity layer region;

removing the first mask material and then covering a forming region of the second transistor with a second mask material;

implanting an impurity in a channel region of the first transistor; and removing the second mask material and then forming the gate electrode, the source layer, and the drain layer.

DETAILED DESCRIPTION OF THE INVENTION

Embodiments of the present invention will be described below with reference to the accompanying drawings. The embodiments do not limit the present invention.

In the following embodiments, SODEL-FETs (Silicon On Depletion Layer Field Effect Transistors) are used as some transistors or all transistors constituting a logic circuit such as an SRAM and a clocked inverter. In this manner, the problem described above can be solved. In the following embodiments, a p-type semiconductor material may be used in place of an n-type semiconductor material, and an n-type semiconductor material may be used in place of a p-type semiconductor material.

(First Embodiment)

Figure 1:
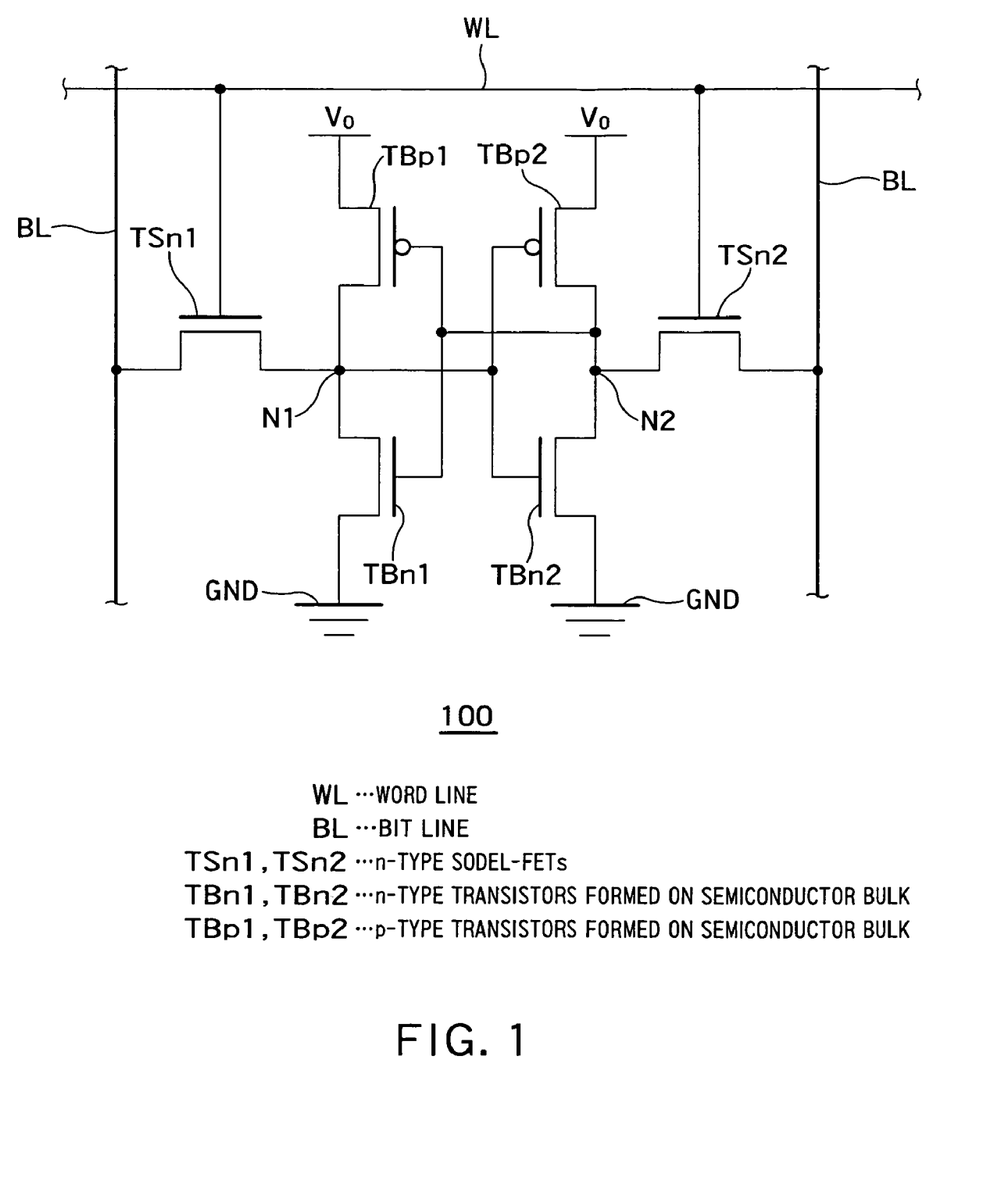
FIG. 1 is a circuit diagram of an SRAM 100 according to the first embodiment of the present invention.

FIG. 1 is a circuit diagram of an SRAM 100 according to the first embodiment of the present invention. In FIG. 1, although only one memory cell is shown, actually a plurality of memory cells are horizontally and vertically arranged.

The SRAM 100 includes a bit line BL, a word line WL, n-type transistors TBn1 and TBn2, p-type transistors TBp1 and TBp2, and n-type SODEL-FETs (to be referred to as SODEL transistors hereinafter) TSn1 and TSn2. The SRAM 100 includes a ground GND serving as a first reference voltage and a power supply voltage V0 serving as a second reference voltage.

The transistor TBn1 and the transistor TBp1 are serially connected between the ground GND and the power supply voltage V0 as a first transistor of a first conductivity type and a first transistor of a second conductivity type. The transistor TBn2 and the transistor TBp2 are serially connected between the ground GND and the power supply voltage V0 as a first transistor of the first conductivity type and a first transistor of the second conductivity type. A connection point between the transistor TBn1 and the transistor TBp1 is defined as a node N1, and a connection point between the transistor TBn2 and the transistor TBp2 is defined as a node N2. The gates of the transistor TBn1 and the transistor TBp1 are connected to the node N2. The gates of the transistor TBn2 and the transistor TBp2 are connected to the node N1. The transistors TBn1, and TBn2 function as driver transistors in which data is stored in the node between TBn1 and TBp1 or TBn2 and TBp2. The transistors TBp1 and TBp2 are referred to as load transistors.

The SODEL transistor TSn1 is connected as a second transistor between the node N1 and the bit line BL. The source (or drain) of the SODEL transistor TSn1 is connected to the bit line BL, and the drain (or source) is connected to the node N1. The SODEL transistor TSn2 is connected as a second transistor between the node N2 and the bit line BL. The source (or drain) of the SODEL transistor TSn2 is connected to the bit line BL, and the drain (or source) is connected to the node N2. Furthermore, the gates of the SODEL transistors TSn1 and TSn2 are connected to the word line WL. The SODEL transistors TSn1 and TSn2 function as transfer gates which transfer data from the bit line BL to the nodes N1 and N2 or transfer data stored in the nodes N1 and N2 to the bit line BL.

Figure 2:
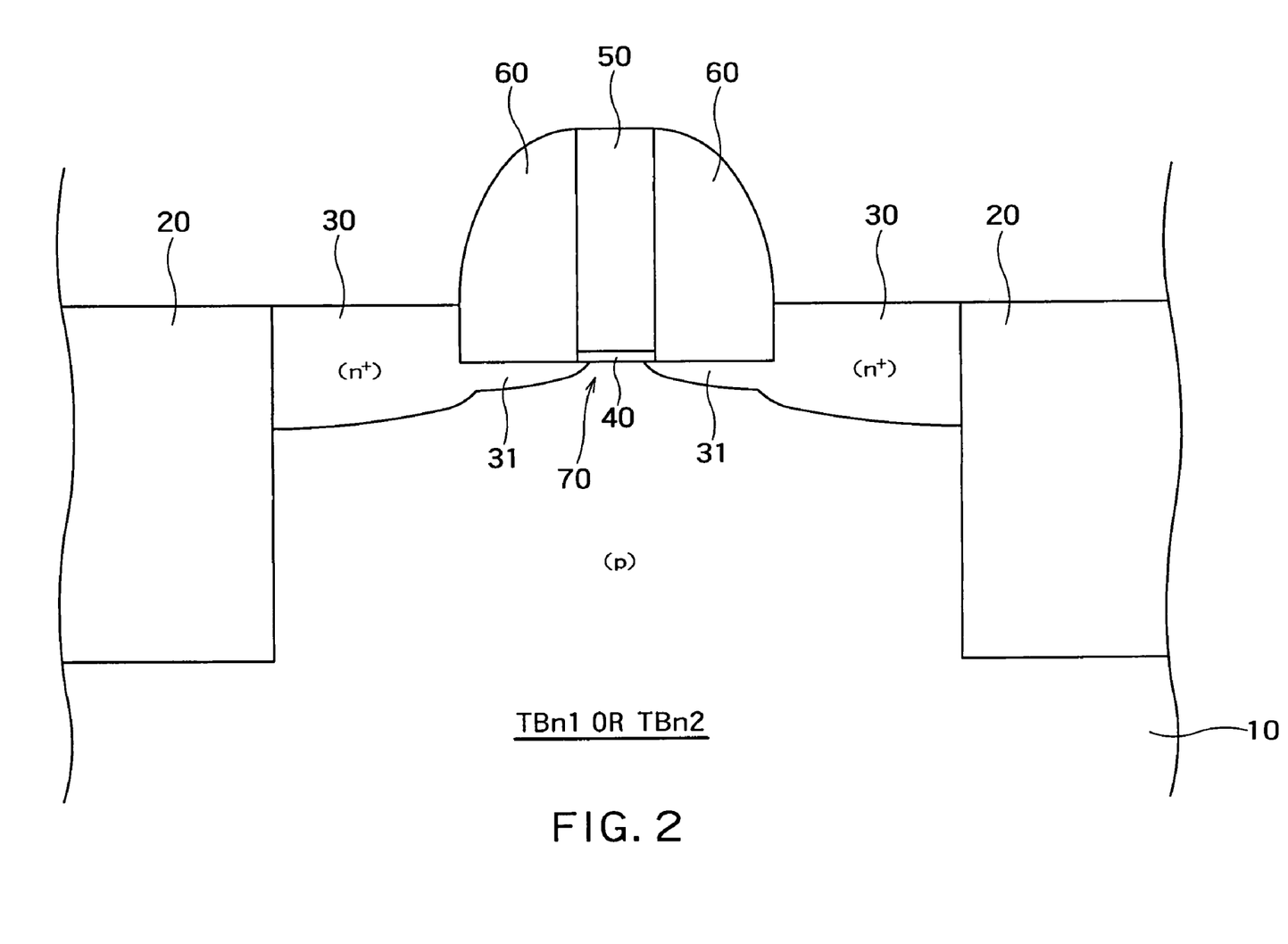
FIG. 2 is a sectional view of transistors TBn1 and TBn2.

FIG. 2 is a sectional view of transistors TBn1 and TBn2. The transistors TB1p and TBp2 may be obtained by inverting the conductivity types of the elements shown in FIG. 2. Therefore, the sectional views of the transistors TBp1 and TBp2 are omitted. The transistors TBn1 and TBn2 are formed on a p-type bulk substrate region 10 isolated by an STI (Shallow Trench Isolation) region 20. The transistors TBn1 and TBn2 include an $n^+$-type source/drain layer 30 and an n-type extension layer 31 extending from the $n^+$-type source/drain layer 30 toward a channel region 70. A gate insulating film 40 is formed on the channel region 70, and a gate electrode 50 is formed on the gate insulating film 40. Spacers 60 are formed on both the sides of the gate electrode 50.

Although not shown, the transistors TBp1 and TBp2 are formed on an n-type bulk substrate region (for example, an n-type well region). The transistors TBp1 and TBp2 include a $p^+$-type source/drain layer and a p-type extension layer extending from the source/drain layer toward the channel region. The transistors TBp1 and TBp2 are different from the transistors TBn1 and TBn2 in conductivity type. However, these transistors are similarly formed on the bulk substrate regions.

Figure 3:
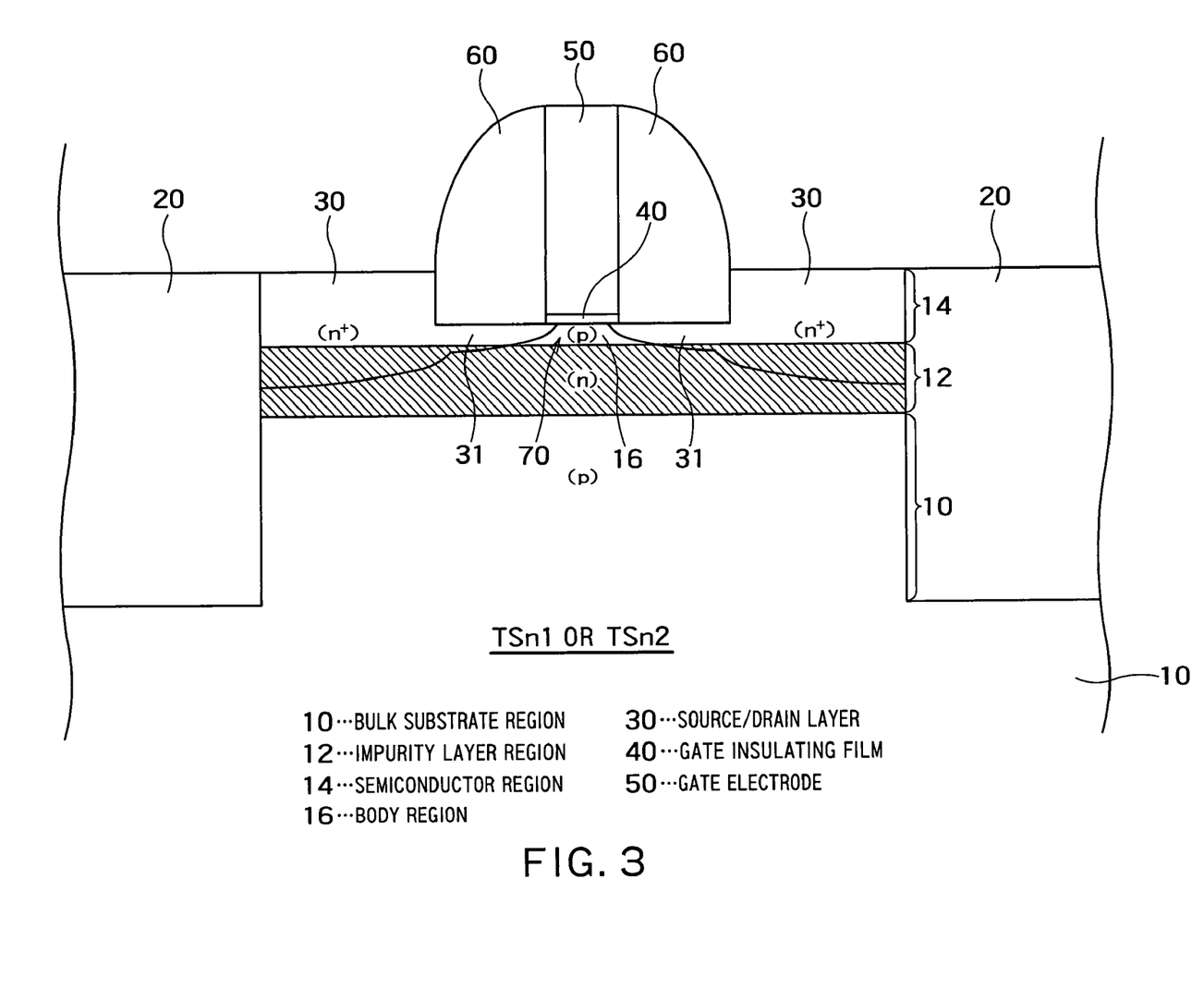
FIG. 3 is a sectional view of the SODEL transistors TSn1 and TSn2.

FIG. 3 is a sectional view of the SODEL transistors TSn1 and TSn2. The p-type SODEL transistors TSp1 and TSp2 may be obtained by inverting the conductivity types of the elements shown in FIG. 3. Therefore, a sectional view of the p-type SODEL transistors TSp1 and TSp2 is omitted.

An n-type impurity layer region 12 is formed on the p-type bulk substrate region 10 isolated by the STI region 20. The p-type semiconductor region 14 is formed on the n-type impurity layer region 12. The SODEL transistors TSn1 and TSn2 are formed in the semiconductor region 14. The n-type impurity layer region 12 is depleted by being formed between the p-type bulk substrate region 10 and the p-type semiconductor region 14.

The $n^+$-type source/drain layer 30 and the n-type extension layer 31 are formed in a body region 14 and partially reach the impurity layer region 12. The gate insulating film 40 is formed on a p-type body region 16 in which a channel is formed. The gate electrode 50 is formed on the gate insulating film 40 on the body region 16.

The body region 16 is surrounded by the source/drain layer 30, the impurity layer region 12, and the gate insulating film 40 and set in an electrically floating state thereby.

Although not shown, the p-type SODEL transistors TSp1 and TSp2 are different from the SODEL transistors TSn1 and TSn2 in conductivity type. However, these transistors are similarly formed on the semiconductor region 14.

In this manner, the SRAM 100 includes normal transistors TBn1, TBn2, TBp1, and TBp2 and the SODEL transistors TSn1 and TSn2, on the same semiconductor substrate.

Figure 4:
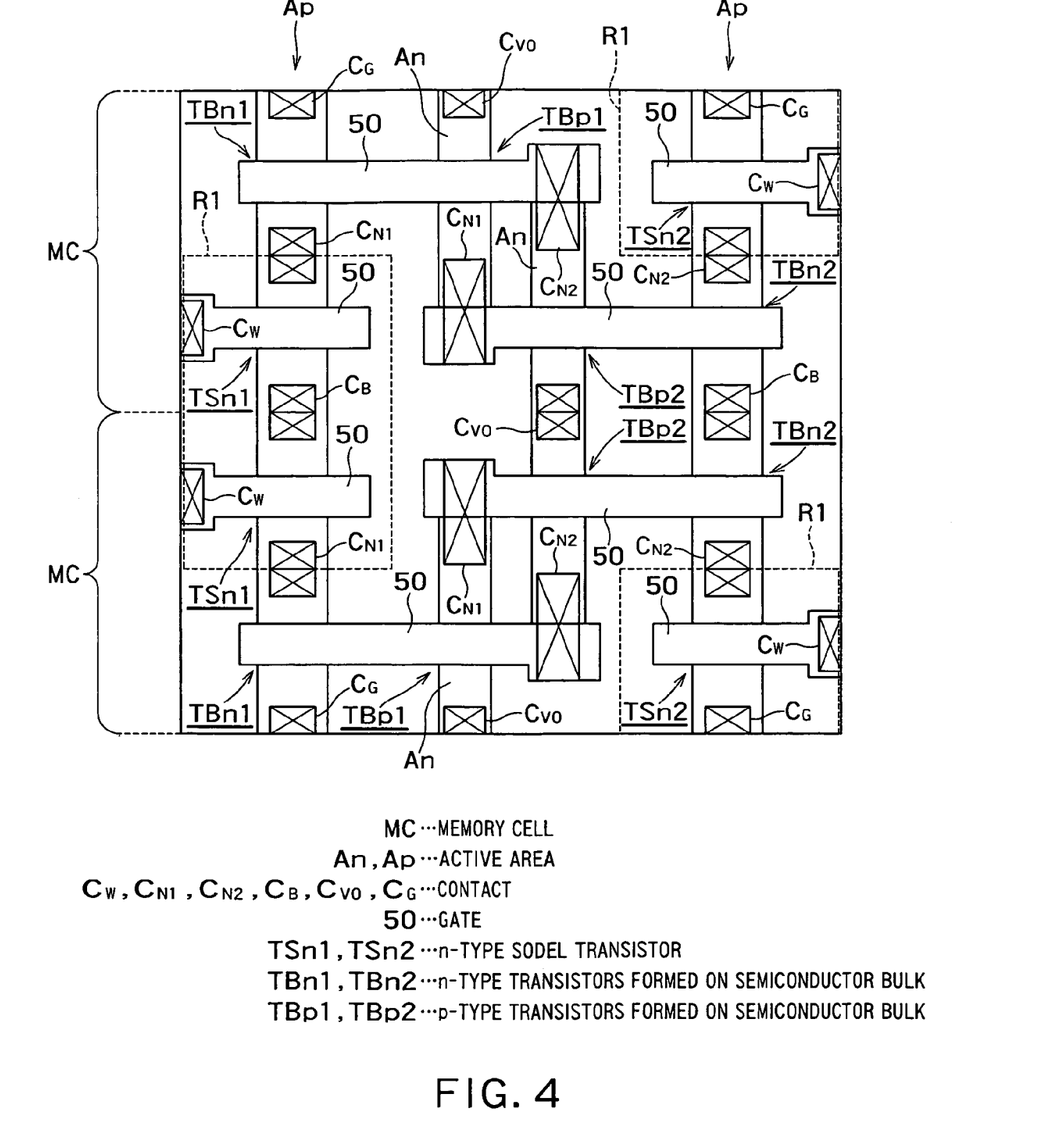
FIG. 4 is a plan view of the SRAM 100.

FIG. 4 is a plan view of the SRAM 100. FIG. 4 shows a state in which two memory cells MC are arranged. A circuit diagram of one memory cell MC is the same as FIG. 1. The n-type SODEL transistors TSn1 and TSn2 and the n-type transistors TBn1 and TBn2 are formed in a p-type active area Ap extending in a vertical direction in FIG. 4. The p-type transistors TBp1 and TBp2 are formed in an n-type active area An extending in a vertical direction in FIG. 4. One or both of the active areas Ap and An are formed in a well region (not shown). The active areas Ap and An are isolated from each other by the well or the STI region.

The gate electrode 50 extends in the horizontal direction in FIG. 4. The SODEL transistors TSn1, and TSn2, and the transistors TBn1, TBn2, TBp1, and TPp2 are formed in cross regions between the active areas Ap, An and the gate electrode 50.

Contact regions $C_W$ are contact regions between the word line WL (see FIG. 1) and the gate electrodes 50 of the SODEL transistors TSn1 and TSn2. Contact regions $C_B$ are contact regions between the bit line BL (see FIG. 1) and the source or drain layers of the SODEL transistors TSn1 and TSn2. Contact regions $C_G$ are contact regions between the ground GND (see FIG. 1) and the source or drain layers of the transistors TBn1 and TBn2. Contact regions $C_{V0}$ are contact regions between the power supply voltage V0 (see FIG. 1) and the source or drain regions of the transistors TBp1 and TBp2. A contact region $C_{N1}$ is a contact region of the node N1 in FIG. 1, and a contact region $C_{N2}$ is a contact region of the node N2 in FIG. 1.

A method of manufacturing the SRAM 100 will be described below with reference to FIGS. 2 to 4. A well region (not shown) and the STI region 20 are formed in the bulk substrate region 10. The transistors TBn1, TBn2, TBp1, and TBp2 are covered with a first mask material (for example, photoresist) (not shown). At this time, a region R1 (broken-line frame in FIG. 4) in which the SODEL transistors TSn1 and TSn2 are to be formed is exposed. Subsequently, an n-type impurity (for example, phosphorous or arsenic) is ion-implanted to form the n-type impurity layer regions 12 in the SODEL transistors TSn1 and TSn2.

The region R1 is covered with a second mask material (for example, photoresist) (not shown). At this time, regions in which the transistors TBn1, TBn2, TBp1, and TBp2 are to be formed are exposed. An impurity is ion-implanted in the channel regions of the transistors TBn1, TBn2, TBp1, and TBp2. At this time, the channel ion implantation to the transistors TBn1 and TBn2 and the channel ion implantation to the transistors TBp1 and TBp2 may be separately performed by using different photoresist masks. After the second mask material is removed, the gate electrode 50 and the source/drain layer 30 are formed.

In this manufacturing method, the region R1 includes two SODEL transistors TSn1 (or TSn2) included in the adjacent memory cells MC. In this manner, the region R1 has an area which is twice the area of the one SODEL transistor. Therefore, even though the SRAM 100 is micropatterned, the n-type impurity layer region 12 can be formed without any problem.

An effect of the first embodiment will be described below. For example, an SODEL transistor is described in Japanese Patent Application Laid Open No. 2002-289850 and S. Inaba et al.: IEDM 2002 pages 659 to 662. The SODEL transistor has a smaller junction capacitance, a smaller junction leakage current, and a smaller body effect than those of a conventional transistor. As a result, the SODEL transistor can obtain a higher speed and a lower power consumption in consideration of a conventional transistor.

These effects can also be achieved by using an SOI. However, since the SODEL transistor is formed on the basis of a bulk substrate, a hole current generated by impact ionization is excluded to the substrate region. Therefore, a threshold voltage shift of the transistor, caused by the accumulation of holes, does not easily occur. Therefore, the deterioration of the device characteristics (kink or the like in Id-Vd characteristics) caused by a substrate floating effect does not easily occur.

On the other hand, in a partially depleted type (PD type) transistor formed on an SOI, a hole current is accumulated in a body region. Therefore, the threshold voltage of the transistor shifts. Furthermore, in the SODEL transistor, self-heating is advantageously suppressed compared to SOI transistor, because a buried oxidation film region (BOX region) is not formed.

The SODEL transistor, as described above, can be relatively easily formed by additionally applying a photolithography technique and an ion implantation technique to a normal bulk substrate. Therefore, the SODEL transistor can be manufactured at a cost lower than that of a transistor formed on an SOI.

The SODEL transistor has the advantageous effects described above. However, in the SODEL transistor, as shown in FIG. 3, since the body region 16 is isolated from the bulk substrate region 10 by the depletion layer region 12, the voltage of the body region 16 easily becomes unstable. Since the SODEL transistor has a junction capacitance smaller than that of a normal transistor, an amount of charge accumulated in the junction capacitance is small, and a noise margin is disadvantageously small. Therefore, low resistance to a soft error and low resistance to noise are concerned.

Therefore, in the first embodiment, the SODEL transistors TSn1 and TSn2 are employed as transfer gates which can reduce the capacitance of the bit line BL and which are required to be operated at a high speed. As driver transistors required to have high resistance to a soft error, the transistors TBn1, TBn2, TBp1, and TBp2 are employed. In this manner, in the first embodiment, high resistance to a soft error can be held while reducing the capacitance of the bit line BL.

(Second Embodiment)

Figure 5:
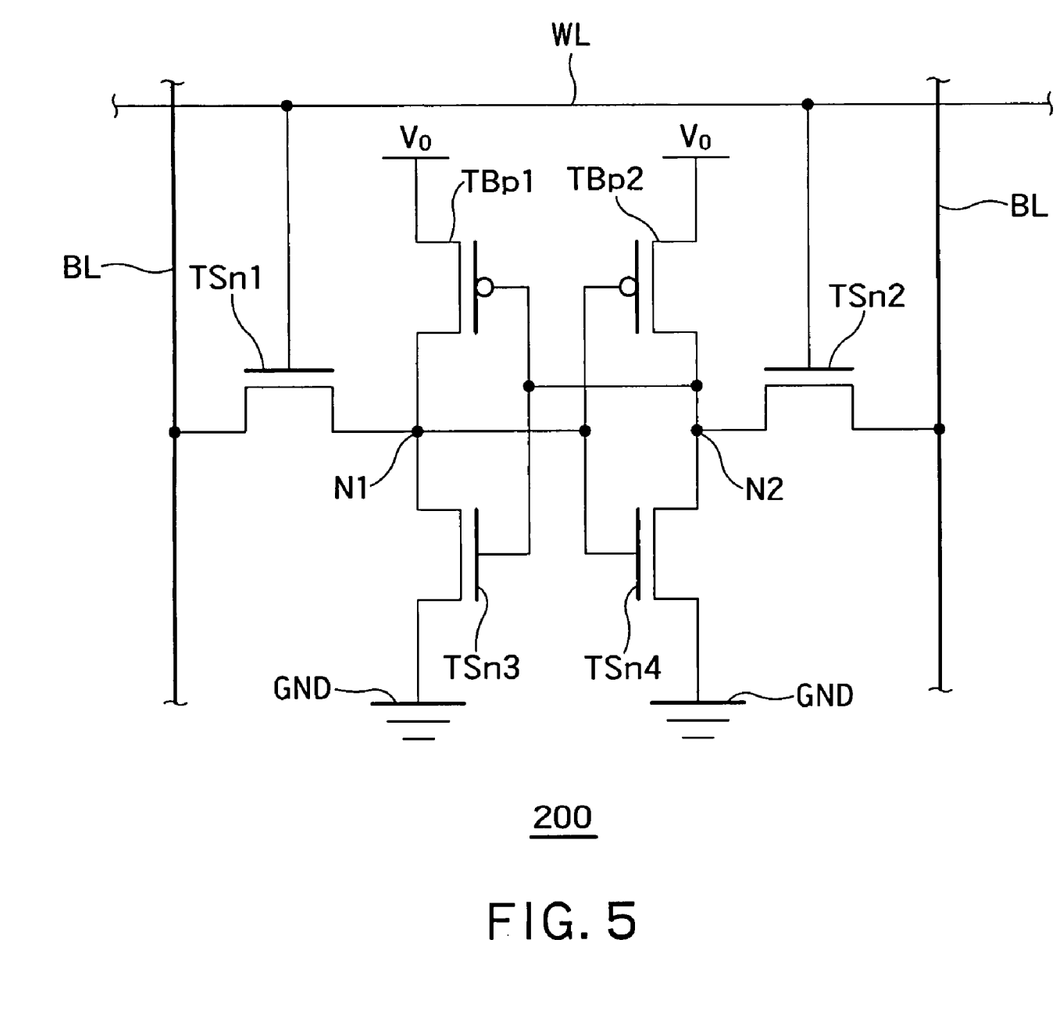
FIG. 5 is a circuit diagram of an SRAM 200 according to the second embodiment of the present invention.

FIG. 5 is a circuit diagram of an SRAM 200 according to the second embodiment of the present invention. The second embodiment is different from the first embodiment in that SODEL transistors TSn3 and TSn4 are employed as n-type driver transistors connected to a ground GND. The other configuration of the second embodiment may be similar to the corresponding configuration of the first embodiment.

In the second embodiment, since the SODEL transistors TSn3 and TSn4 are used as an n-type driver transistor, an operation at a speed higher than that of the first embodiment can be obtained. On the other hand, as a p-type load transistor connected to a power supply voltage V0, transistors TBp1 and TBp2 are similarly employed as in the first embodiment. Therefore, the semiconductor integrated circuit device according to the second embodiment can hold high resistance to a soft error to some extent. In this manner, when high resistance to a soft error is importantly considered, the first embodiment may be employed. When a high-speed operation of the element is importantly considered, the second embodiment may be employed.

In the second embodiment, all n-type transistors in memory cells are constituted by SODEL transistors. Therefore, as in a region R2 shown in FIG. 6, a mask used in formation of the impurity layer region 12 has a belt-like shape (striped shape) along a p-type active area Ap. Since the region R2 is larger than the region R1 shown in FIG. 4, a lithography process can be relatively easily performed. The second embodiment is applied to micropatterning more suitably than the first embodiment.

Figure 6:
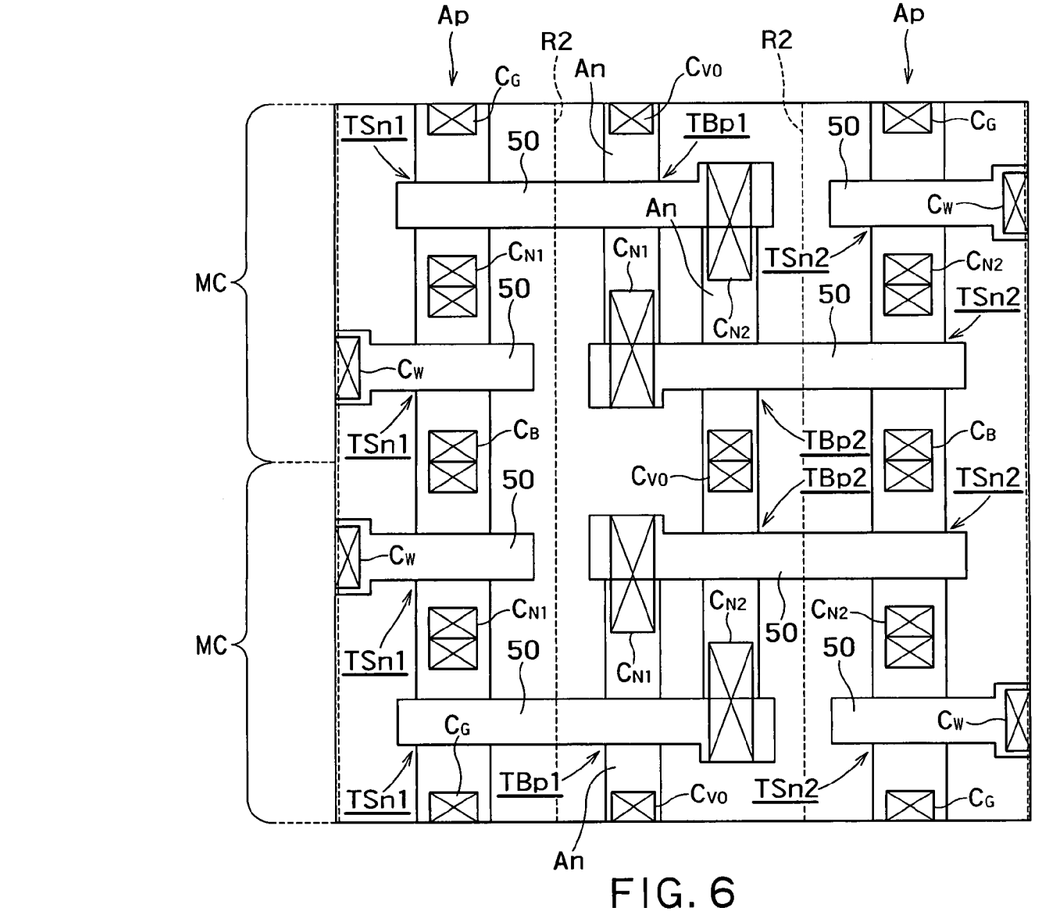
FIG. 6 is a plain view of an SRAM 200.

More specifically, since all the n-type transistors in the memory cells are constituted by SODEL transistors, ion implantation to the channel regions of the n-type transistors can be performed in one step. At this time, only one mask is required. Furthermore, since the region R2 is larger than the region R1, a photomask can be manufactured at high accuracy.

(Third Embodiment)

Figure 7:
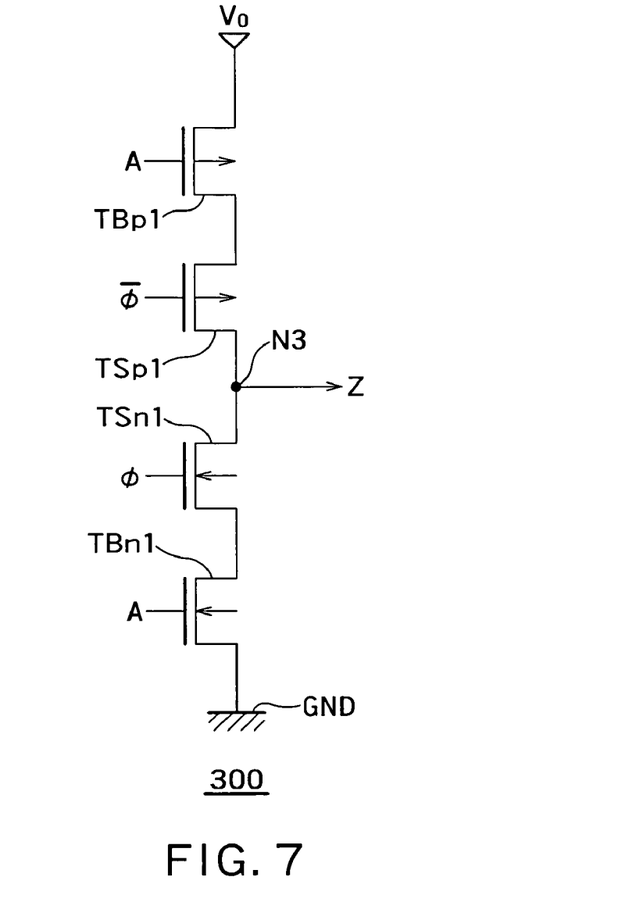
FIG. 7 is a circuit diagram of a clocked inverter 300 according to the third embodiment of the present invention.

FIG. 7 is a circuit diagram of a clocked inverter 300 according to the third embodiment of the present invention. The clocked inverter 300 includes an n-type transistor TBn1, an n-type transistor TSn1, a p-type transistor TSp1, and a p-type transistor TBp1. These transistors are serially connected between a ground GND and a power supply voltage V0 in an order named: the n-type transistor TBn1, the n-type SODEL transistor TSn1, the p-type SODEL transistor TSp1, and the p-type transistor TBp1.

A data signal A is input to the gate electrodes of the transistors TBn1 and TBp1. Clock signals (φ and (φ bar, which have reversed phases each other, are input to the SODEL transistors TSn1 and TSp1, respectively. When the transistors TSn1 and TSp1 are in on states by the clock signals φ and (φ bar, the inverted signal of the data signal A is output from a node N3 between the SODEL transistors TSn1 and TSp1.

According to the third embodiment, since the junction capacitance of an SODEL transistor is small, the SODEL transistors TSn1 and TSp1 can operate adequately with respect to high-speed clock signals and can operate at high speed.

The SODEL transistors TSn1 and TSp1 are connected to the ground GND or the power supply voltage V0 through the transistor TBn1 or TBp1. Therefore, when normal transistors shown in FIG. 2 are employed in place of the SODEL transistors TSn1 and TSp1, it is concerned that a threshold voltage shifts due to a back bias effect. However, since a body region 16 is isolated from a bulk substrate region 10 by an impurity layer region 12 in the SODEL transistors TSn1 and TSp1 as shown in FIG. 3, when the SODEL transistors TSn1 and TSp1 are employed, a threshold voltage does not shift.

Furthermore, transistors to which a data signal is input are the normal transistors TBn1 and TBp1. The transistors TBn1 and TBp1 have junction capacitance larger than those of SODEL transistors. Therefore, the transistors TBn1 and TBp1 have high resistance to noise.

In this manner, according to the third embodiment, high resistance to noise can be held while reducing the junction capacitance of transistors to which clock signals are input. In addition, since the junction capacitance is small, a low power consumption can be achieved.

When a high-speed operation of a device is importantly considered as a modification of the third embodiment, all the transistors shown in FIG. 7 may be constituted by SODEL transistors.

(Fourth Embodiment)

Figure 8:
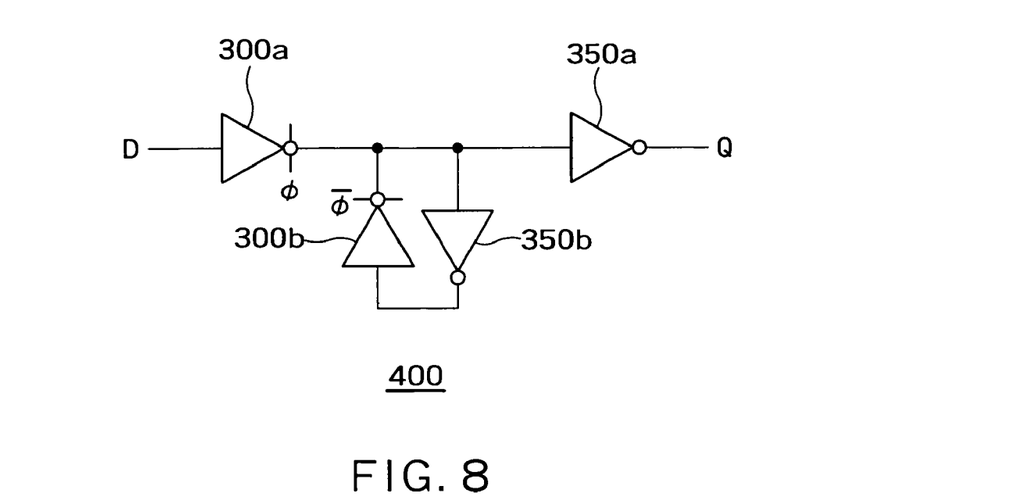
FIG. 8 is a circuit diagram of a latch circuit 400 according to an embodiment of the present invention.

FIG. 8 is a circuit diagram of a latch circuit 400 according to an embodiment of the present invention. The latch circuit 400 includes a data input D, a data output Q, two normal inverters 350a and 350b, and two clocked inverters 300a and 300b. As the clocked inverters 300a and 300b, the clocked inverter 300 shown in FIG. 7 may be used. As the clocked inverters 300a and 300b, the inverters in the modification of the third embodiment may also be used. Although not shown, the configurations of the normal inverters 350a and 350b may be equal to those of conventional CMOS inverters.

The normal inverter 350a and the clocked inverter 300a are serially connected between the data input D and the data output Q. The output of the normal inverter 350b is connected to the input of the clocked inverter 300b. The input of the normal inverter 350b and the input of the normal inverter 300b are connected to a node between the normal inverter 350a and the clocked inverter 300a.

According to the fourth embodiment, the clocked inverter can be operated at a high speed, and resistance to noise can be held high. Furthermore, since the junction capacitance is small, a low power consumption can be achieved.

(Fifth Embodiment)

Figure 9:
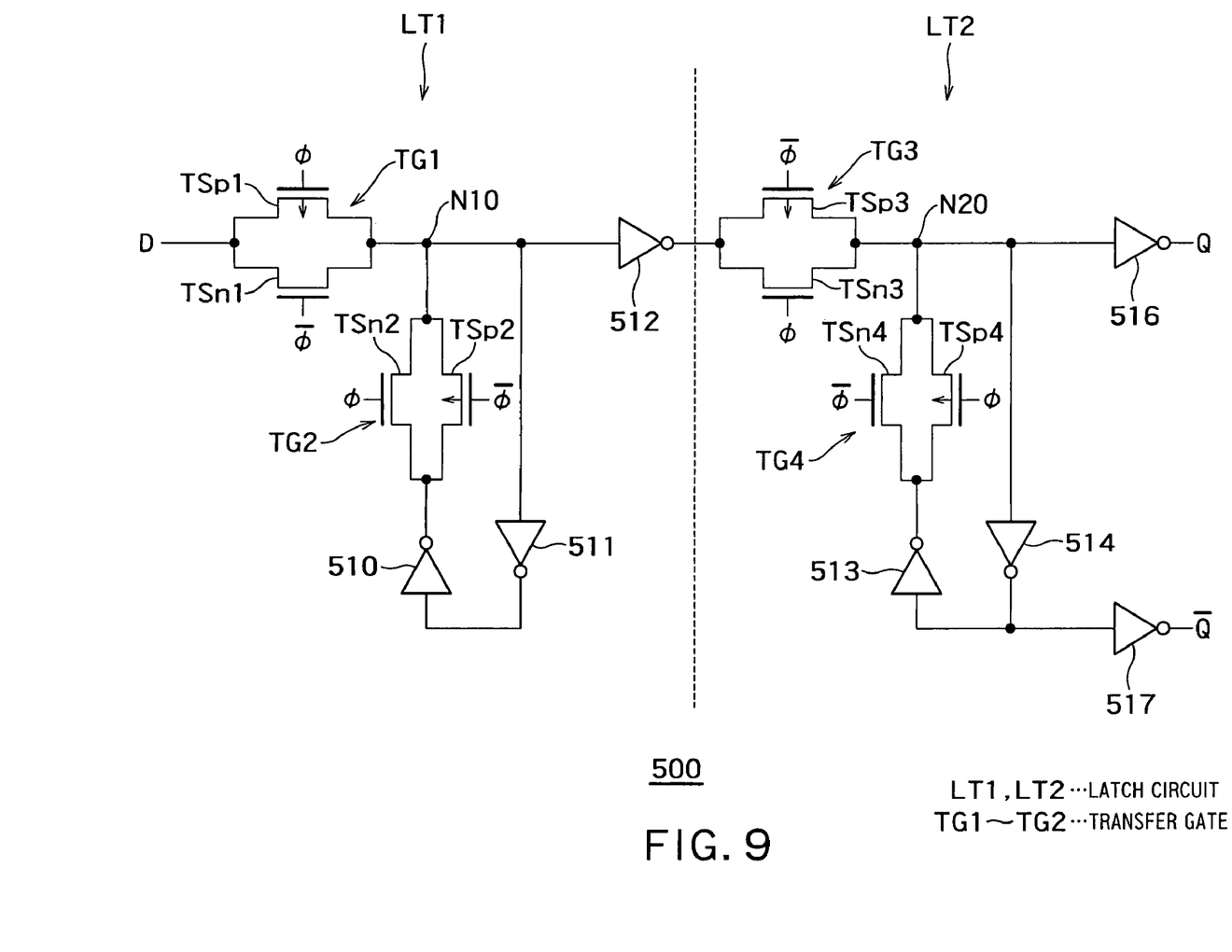
FIG. 9 is a circuit diagram of a flipflop circuit 500 according to the fifth embodiment of the present invention.

FIG. 9 is a circuit diagram of a flipflop circuit 500 according to the fifth embodiment of the present invention. The flipflop circuit 500 includes two latch circuits LT1 and LT2 which are serially connected between a data input D and a data output Q (Q bar). A data output Q bar is a reversed signal of the data output Q.

The latch circuit LT1 includes transfer gates TG1 and TG2 and inverters 510 to 512. The transfer gate TG1 is connected between the data input D and a node N10. The transfer gate TG2 is connected between the node N10 and the output of the inverter 510. The inverter 511 is connected between the node N10 and the input of the inverter 510. The inverter 512 is connected between the node N10 and the latch circuit LT2.

The transfer gate TG1 is constituted by SODEL transistors TSn1 and TSp1 which are connected in parallel to each other. Clocked signals φ and φ bar, which have reversed phases each other, are input to the gates of the SODEL transistors TSn1 and TSp1, respectively. The transfer gate TG2 is constituted by SODEL transistors TSn2 and TSp2 which are connected in parallel to each other. Clocked signals φ and φ bar, which have reversed phases each other, are input to the gates of the SODEL transistors TSn2 and TSp2, respectively.

The latch circuit LT2 includes transfer gates TG3 and TG4 and inverters 513 to 517. The transfer gate TG3 is connected between the latch circuit LT1 and a node N20. The transfer gate TG2 is connected between the node N20 and the output of the inverter 513. The inverter 514 is connected between the node N20 and the input of the inverter 513. The inverter 516 is connected between the node N20 and the data output Q. The inverter 517 is connected between the input of the inverter 513 and the data output Q bar.

The transfer gate TG3 is constituted by SODEL transistors TSn3 and TSp3 which are connected in parallel to each other. Clocked signals φ and φ bar, which have reversed phases each other, are input to the gates of the SODEL transistors TSn3 and TSp3, respectively. The transfer gate TG4 is constituted by SODEL transistors TSn4 and TSp4 which are connected in parallel to each other. Clocked signals (φ and (φ bar, which have reversed phases each other, are input to the gates of the SODEL transistors TSn4 and TSp4, respectively.

According to the fifth embodiment, the SODEL transistors are used as the transfer gates TG1 to TG4 to make it possible to operate the flipflop circuit 500 at a high speed and to reduce the power consumption of the flipflop circuit 500. Furthermore, the inverters 510 to 517 are constituted by the normal transistors shown in FIG. 2. Therefore, the flipflop circuit 500 can keep resistance to a software error high.

As a modification of the fifth embodiment, SODEL transistors are employed as the transistors constituting the inverters 510 to 517. The modification can bring about an operation at a speed higher than that of the fifth embodiment. When a high-speed operation of the element is importantly considered, the modification may be employed. When resistance to noise is importantly considered, the fifth embodiment may be employed.

(Sixth Embodiment)

Figure 10:
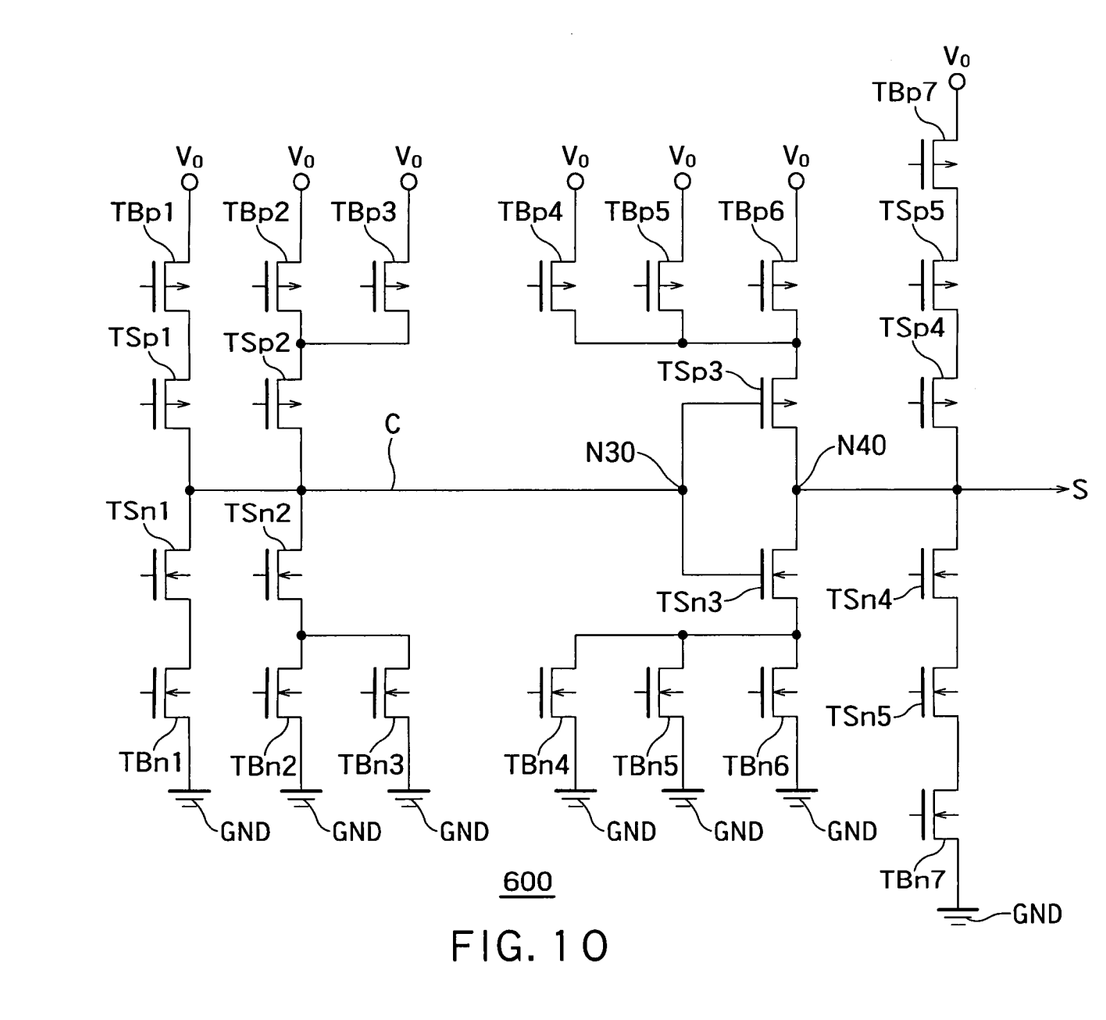
FIG. 10 is a circuit diagram of a full adder circuit 600 according to the sixth embodiment of the present invention.

FIG. 10 is a circuit diagram of a full adder circuit 600 according to the sixth embodiment of the present invention. The full adder circuit 600 includes transistors TBp1 to TBp7 and TBn1 to TBn7 and SODEL transistors TSp1 to TSp7 and TSn1 to TSn7 which are connected between a ground GND and the power supply voltage V0. A first node N30 propagates a carry C, and a second node N40 propagates a result of addition.

The transistors TBp1 to TBp7 and TBn1 to TBn7 are directly connected to the ground GND or the power supply voltage V0, and are normal transistors formed on a bulk substrate region 10. The SODEL transistors TSp1 to TSp7 and TSn1 to TSn7 are connected between any one of the transistors TBp1 to TBp7, TBn1 to TBn7 and the node N30 or N40.

In general, when a wiring load does not affect delay time and an input waveform is sharp, an input (top switching) to a transistor relatively close to the nodes N30 and N40 is faster than an input (bottom switching) to a transistor relatively far from the nodes N30 and N40.

According to the sixth embodiment, the transistors connected to the nodes N30 and N40 are the SODEL transistors TSp1 to TSp7 and TSn1 to TSn7. Therefore, the full adder circuit 600 can be operated at a high speed, and a power consumption thereof can be reduced. Since the operation speeds of the SODEL transistors TSp1 to TSp7 and TSn1 to TSn7 depending on the top switching, the speed of the entire operation of the full adder circuit 600 is equal with regard to the input signal.

The transistors directly connected to the ground GND and the power supply voltage V0 are the normal transistors TBp1 to TBp7 and TBn1 to TBn7 formed on the bulk substrate region. Therefore, the full adder circuit 600 can keep resistance to noise high. In addition, the SODEL transistors TSp1 to TSp7 and TSn1 to TSn7 are connected to the ground GND and the power supply voltage V0 through the transistors TBp1 to TBp7 and TBn1 to TBn7. However, since the SODEL transistors TSp1 to TSp7 and TSn1 to TSn7 have impurity layer regions 12, the threshold voltages do not shift.

(Seventh Embodiment)

Figure 11:
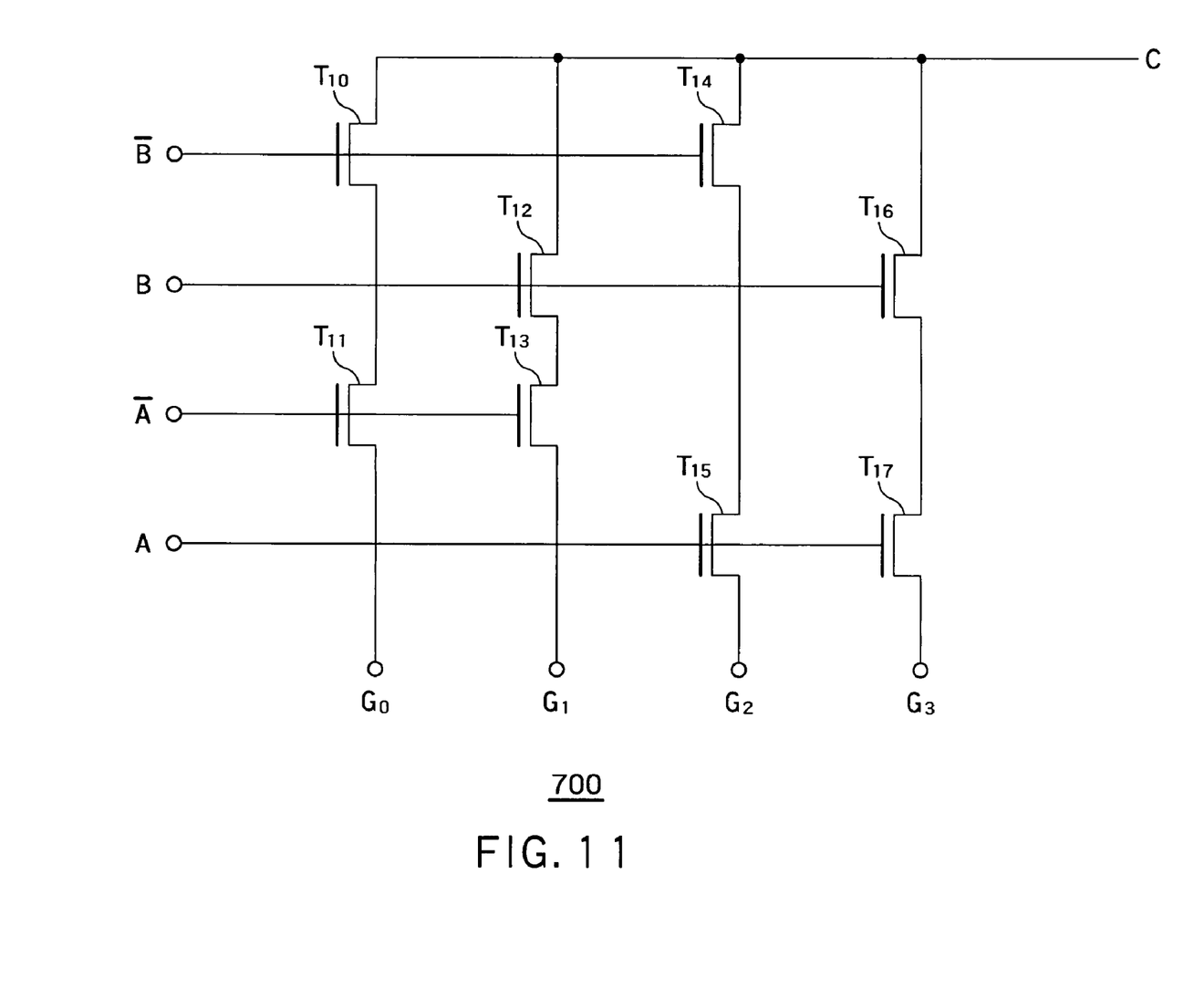
FIG. 11 is a circuit diagram of an ALU according to the seventh embodiment of the present invention.

FIG. 11 is a circuit diagram of an ALU (Arithmetic Logic Unit) according to the seventh embodiment of the present invention. The ALU 700 executes an arithmetic operation or logical calculation to output the result from an output node C. Among transistors T10 to T17 included in the ALU 700, at least transistors connected to the output node C are constituted by SODEL transistors. As a result, the speed of both the arithmetic operation and the logical calculation by the ALU 700 can be increased, and the power consumption thereof can be reduced.

All the transistors T10 to T17 included in the ALU 700 may be constituted by the SODEL transistors. In this manner, the ALU 700 can be operated at a high speed, and the power consumption thereof can be reduced.

What is claimed is:

1. A semiconductor integrated circuit device comprising:
a first transistor formed on a bulk substrate region in a semiconductor substrate and having a source or drain layer connected to a first reference voltage; and
a second transistor including an impurity layer region formed on the bulk substrate region and being of a conductivity type different from that of the bulk substrate region, a semiconductor region formed on the impurity layer region and being of a conductivity type the same as that of the bulk substrate region, a source layer and a drain layer formed in the semiconductor region and being of a conductivity type different from that of the bulk substrate region, a gate insulating film provided between the source layer and the drain layer and formed on the semiconductor region, a gate electrode formed on the gate insulating film, and a body region surrounded by the source layer, the drain layer, the impurity layer region, and the gate insulating film on a section along a source-drain direction and being of a conductivity type the same as that of the bulk substrate region, the impurity layer region being depleted, wherein
the source layer or the drain layer of the second transistor is connected to the first reference voltage through the first transistor.

2. The semiconductor integrated circuit device according to claim 1 comprising:
a SRAM including a bit line, a word line, a second reference voltage different from the first reference voltage, the first transistor of a first conductivity type, the first transistor of a second conductivity type and the second transistor of the first conductivity type, wherein
the first transistor of the first conductivity type and the first transistor of the second conductivity type are serially connected between the first reference voltage and the second reference voltage,
the second transistor is connected between a node and the bit line, the node connecting between the first transistor of the first conductivity type and the first transistor of the second conductivity type, the second transistor acting as a transfer gate transferring a data.

3. The semiconductor integrated circuit device according to claim 1 comprising:
a SRAM including a bit line, a word line, a second reference voltage different from the first reference voltage, the first transistor of a first conductivity type and the second transistors of a second conductivity type, wherein
the first transistor and one of the second transistors are serially connected between the first reference voltage and the second reference voltage,
the other of the second transistors is connected between a node and the bit line, the node connecting between the first transistor and the one of the second transistors, the other of the second transistors acting as a transfer gate transferring a data.

4. The semiconductor integrated circuit device according to claim 1 comprising:
a clocked inverter including a second reference voltage different from the first reference voltage, the first transistor of a first conductivity type, the first transistor of a second conductivity type, the second transistor of the first conductivity type and the second transistors of a second conductivity type, wherein
the first transistor of the first conductivity type, the second transistor of the first conductivity type, the second transistor of the second conductivity type and the first transistor of the second conductivity type are serially connected between the first reference voltage and the second reference voltage in this order,
wherein gates of the first transistors input a data signal, gates of the second transistors input a clock signal, and a reverse signal of the data signal is output from a node between the second transistors.

5. The semiconductor integrated circuit device according to claim 1 comprising:
a clocked inverter including a second reference voltage different from the first reference voltage, the second transistors of a first conductivity type and the second transistors of a second conductivity type, wherein
the second transistor of the first conductivity type, the second transistor of the first conductivity type, the second transistor of the second conductivity type and the second transistor of the second conductivity type are serially connected between the first reference voltage and the second reference voltage in this order,
wherein gates of the second transistors connected directly to the first or the second reference voltage input a data signal, gates of the other second transistors connected to the first or the second reference voltage through the ones of the second transistors input a clock signal, and a reverse signal of the data signal is output from a node between the other second transistors.

6. The semiconductor integrated circuit device according to claim 4 comprising:
a latch circuit including a data input portion, a data output portion, two normal inverters and two clocked inverters, wherein
one of the normal inverters and one of the clocked inverters are connected serially between the data input portion and the data output portion,
wherein an output of the other of the normal inverters is connected to an input of the other of the clocked inverters, an input of the other of the normal inverters and an output of the other of the clocked inverters are connected to a node between the one of the normal inverters and the one of the clocked inverters.

7. The semiconductor integrated circuit device according to claim 1 comprising:
a latch circuit including a data input portion, a data output portion, two normal inverters, and two transfer gates having respectively the second transistor of the first conductivity type and the second transistor of the second conductivity type connected in parallel with each other, wherein,
one of the normal inverters and one of the transfer gates are connected serially between the data input portion and the data output portion,
wherein an output of the other of the normal inverters is connected to an input of the other of the transfer gates, an input of the other of the normal inverters and an output of the other of the transfer gates are connected to a node between the one of the normal inverters and the one of the transfer gates.

8. The semiconductor integrated circuit device according to claim 7 further comprising:
a flip-flop having the two latch circuits connected serially between the data input portion and the data output portion.

9. The semiconductor integrated circuit device according to claim 1 further comprising:
an adder circuit including a second reference voltage different from the first reference voltage, the first transistor of a first conductivity type connected directly to the first reference voltage, the first transistor of a second conductivity type connected directly to the second reference voltage, the second transistor of the first conductivity type connected between the first transistor of a first conductivity type and a node transferring a result signal of carry or addition, and the second transistor connected between the first transistor of the second conductivity type and the node.

10. The semiconductor integrated circuit device according to claim 1, wherein
the second transistor is a SODEL FET.

* * * * *